United States Patent
Spannagl et al.

(10) Patent No.: US 9,039,501 B2
(45) Date of Patent: May 26, 2015

(54) DEVICE FOR COOLING AN ELECTRICAL CABINET

(75) Inventors: Peter Spannagl, Krems (AT); Leopold Hackl, Martinsberg (AT)

(73) Assignee: Kapsch TrafficCom AG, Vienna (AT)

( * ) Notice: Subject to any disclaimer, the term of this patent is extended or adjusted under 35 U.S.C. 154(b) by 873 days.

(21) Appl. No.: 13/171,908

(22) Filed: Jun. 29, 2011

(65) Prior Publication Data
US 2012/0006513 A1    Jan. 12, 2012

(30) Foreign Application Priority Data
Jul. 8, 2010  (EP) .................................. 10 450 116

(51) Int. Cl.
*H05K 5/00* (2006.01)
*H05K 7/20* (2006.01)
*E01F 9/011* (2006.01)

(52) U.S. Cl.
CPC ............ *H05K 7/2059* (2013.01); *E01F 9/0113* (2013.01)

(58) Field of Classification Search
USPC .......................................................... 454/184
IPC ........................................................ H05K 5/00
See application file for complete search history.

(56) References Cited

U.S. PATENT DOCUMENTS

| 6,109,525 A | 8/2000 | Blomqvist et al. |
| 7,614,943 B2 * | 11/2009 | Lee ................................ 454/184 |
| 8,490,354 B2 * | 7/2013 | Robinson ..................... 52/293.2 |

FOREIGN PATENT DOCUMENTS

| WO | WO 2007/108765 A1 | 9/2007 |
| WO | WO 2009/049384 A2 | 4/2009 |

OTHER PUBLICATIONS

Extended European Search Report for corresponding European Patent Application No. 10 450 116.8, dated Dec. 10, 2010, 5pp.

* cited by examiner

*Primary Examiner* — Steven B McAllister
*Assistant Examiner* — Helena Kosanovic
(74) *Attorney, Agent, or Firm* — Fiala & Weaver P.L.L.C.

(57) ABSTRACT

Device for cooling an electrical cabinet including a hollow upright beam having a lower end, an upper end and a cavity inside, the upright beam having an air inlet at the lower end and an air outlet at the upper end, the upright beam supporting the electrical cabinet on a side of the upright beam. The device further includes a first flow connection formed between the interior of the electrical cabinet and the cavity of the upright beam at a level of the lower end of the electrical cabinet; a second flow connection formed between the interior of the electrical cabinet and the cavity of the upright beam at a level of the upper end of the electrical cabinet; and a sealing element at an intermediate level between the first and second flow connections to block the cavity of the upright beam.

11 Claims, 2 Drawing Sheets

DEVICE FOR COOLING AN ELECTRICAL CABINET

CROSS-REFERENCE TO RELATED APPLICATION(S)

This application claims priority to European Patent Application No. 10 450 116.8, filed on Jul. 8, 2010, the contents of which are hereby expressly incorporated by reference.

FIELD OF THE INVENTION

The present invention relates to a device for cooling an electrical cabinet.

BACKGROUND

Waste heat occurs in electrical cabinets that must be removed to prevent overheating of the electronic components contained therein. Numerous solutions are known for cooling electrical cabinets, such as passive cooling fins for increasing the radiation surface or active components such as fans, air conditioning systems etc. It is known from publication WO 2007/108765 A1 to arrange an electrical cabinet in a hollow antenna mast, which has an air inlet at its lower end and an air outlet at its upper end, by means of which the electrical cabinet is cooled by the air flow rising in the mast and circulating around it. This cooling solution is only possible in a corresponding installation situation in a mast.

SUMMARY

The present invention provides a device for cooling an electrical cabinet, without expensive and energy-consuming active components. The device is also suitable for a wider variety of installation situations.

The device according to the invention includes a hollow upright beam having a lower end, an upper end and a cavity inside, the upright beam having an air inlet at the lower end and an air outlet at the upper end, the upright beam supporting the electrical cabinet on a side of the upright beam. The device further includes a first flow connection formed between the interior of the electrical cabinet and the cavity of the upright beam at a level of the lower end of the electrical cabinet; a second flow connection formed between the interior of the electrical cabinet and the cavity of the upright beam at a level of the upper end of the electrical cabinet; and a sealing element at an intermediate level between the first and second flow connections to block the cavity of the upright beam.

Electrical cabinets are frequently mounted on hollow upright beams such as masts, bridge pylons, supports etc. and therefore the cavity thereof can be utilised to transport a cooling air flow through the electrical cabinet on the basis of the stack effect, that is, warm air rising in a vertical shaft. As such, the air flow rising in the upright beam is forcibly diverted via the electrical cabinet, because the cavity of the upright beam is blocked between the first and the second flow connections to the electrical cabinet. An effective passive cooling of electrical cabinets in numerous installation situations can be achieved in this way with few means.

In some embodiments, the upright beam is a steel upright of a bridge spanning a road and its air inlet is a discharge opening for condensation at the lower end of the steel upright. Such condensate discharge openings are generally provided in steel uprights for corrosion protection and therefore can also be advantageously used in appropriate dimensions.

In general, the sealing element installed in the upright beams can be of any desired type, for example, a sealing plug inserted into the upright beam from one end thereof, a partition wall welded into the upright beam or the like. The sealing element is preferably a curable sealing foam injected into the cavity, which is inserted into the upright beam, for example, via a separate opening.

Optionally, the electrical can be additionally fitted with a fan for forced convection. Similarly, the air outlet of the upright beam can be additionally provided with an extractor fan.

BRIEF DESCRIPTION OF THE DRAWINGS

The invention is explained in more detail below on the basis of an exemplary embodiment shown in the attached drawing.

DETAILED DESCRIPTION

Figure 1:
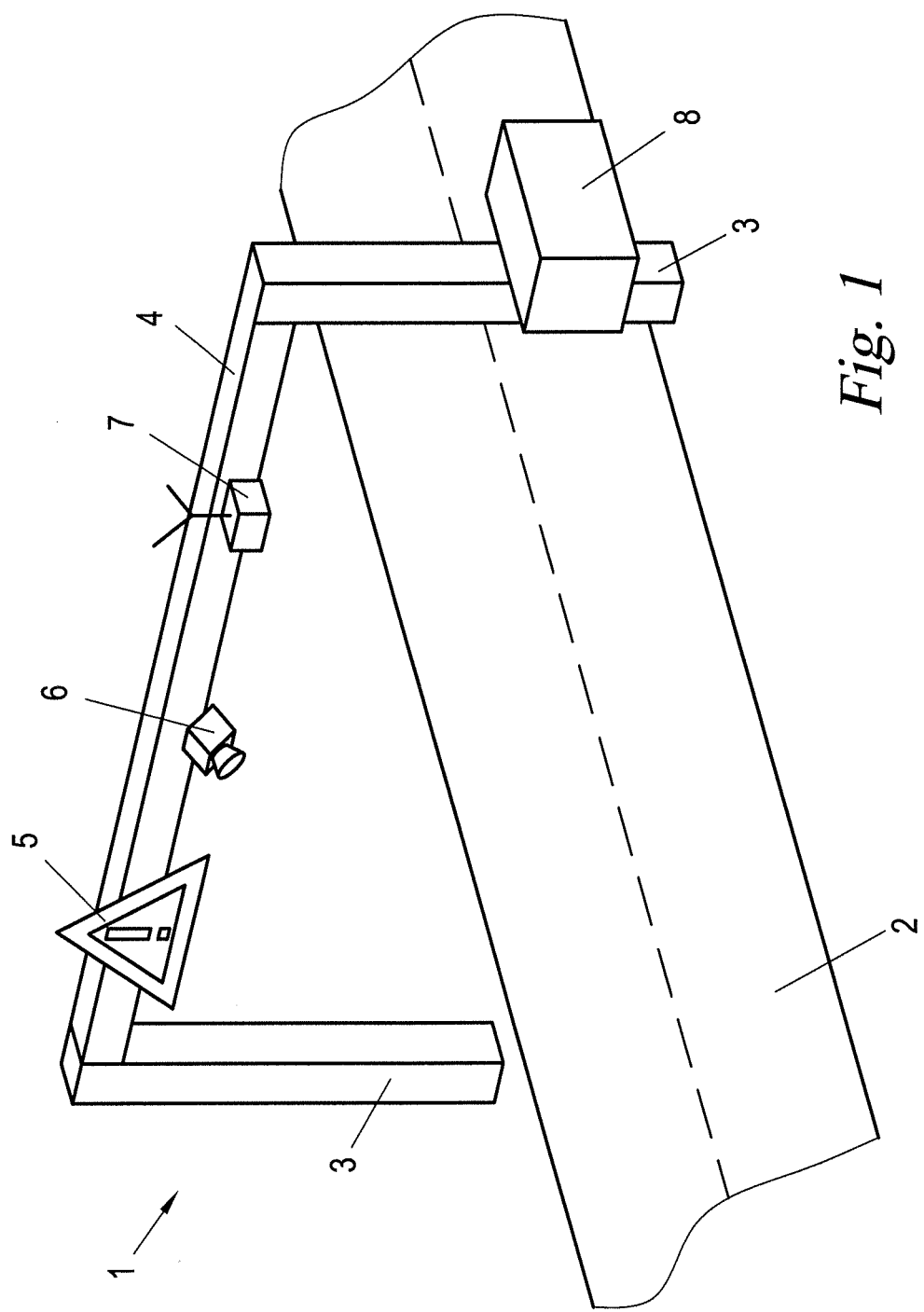
FIG. 1 is a perspective view of an electrical cabinet mounted on an upright beam, according to some embodiments of the present invention.

FIG. 1 shows a bridge 1, which spans a road 2 and is composed of two vertical upright beams 3 and a horizontal cross beam 4. The bridge 1 is, for example, an assembly bridge for traffic signs 5, traffic monitoring cameras or scanners 6, radio beacons 7 for radio communication with vehicles etc. An electrical cabinet 8 is mounted on one of the upright beams 3 to receive connection components for parts 5-7.

Figure 2:
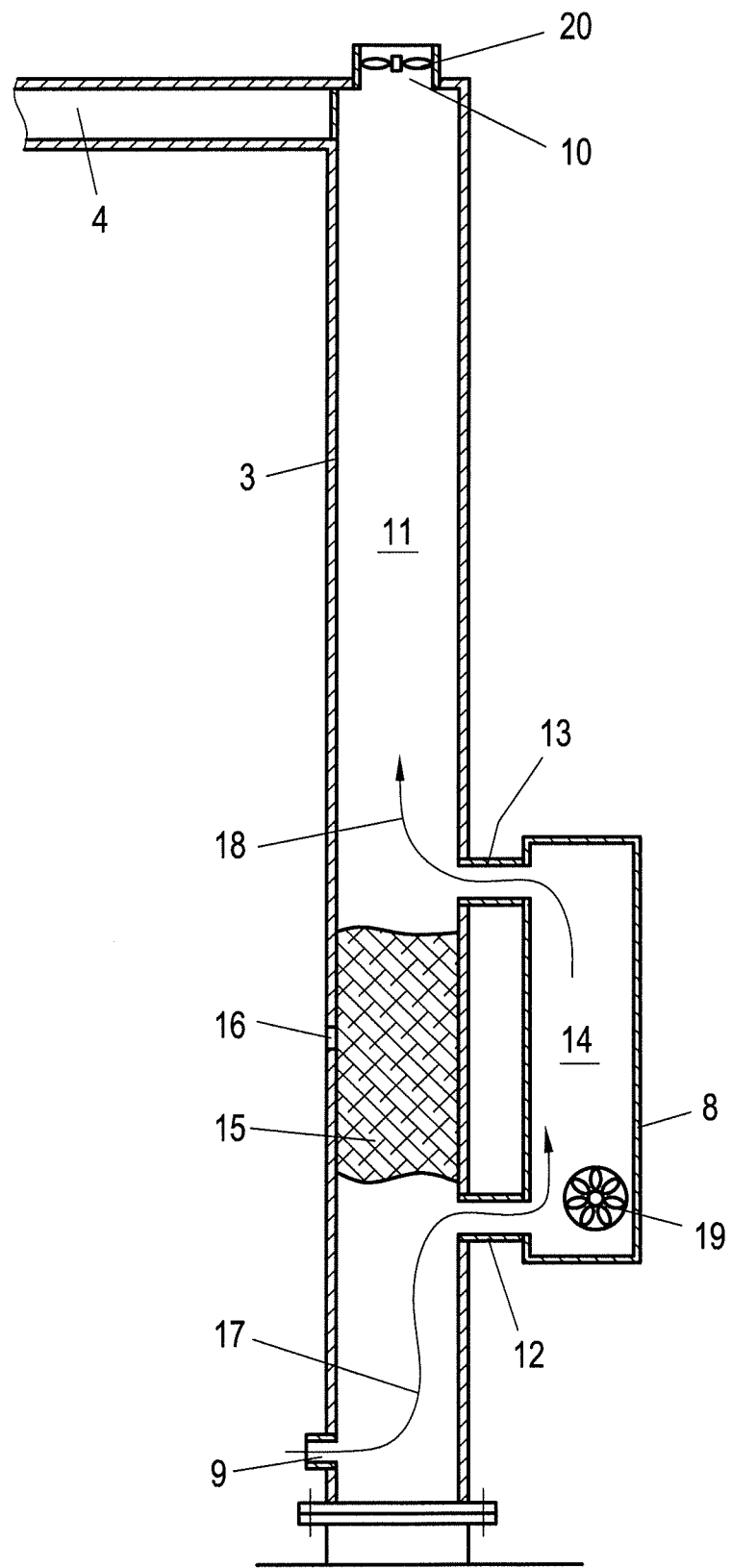
FIG. 2 is a sectional view of the upright beam and the electrical cabinet of FIG. 1.

As may be seen from FIG. 2, the upright beam 3 is hollow and is provided with an air inlet 9 at its lower end and an air outlet 10 at its upper end. The air inlet 9 is formed, for example, by an appropriately dimensioned discharge opening for condensate such as that usually provided in steel uprights for corrosion protection purposes.

During the course of the day as a result of the heating of the air column in the cavity 11 of the upright beam 3 or also as a result of the heating of the air in the electrical cabinet, a vertical upward flow occurs from the inlet 9 to the outlet 10, because of the stack effect. This flow is used to cool the electrical cabinet 8. As such, at the level of the lower and the upper end of the electrical cabinet 8, a flow connection 12, 13 is respectively created between the interior 14 of the electrical cabinet 8 and the cavity 11 of the upright beam 3. The flow connections 12, 13 can be short tubing pieces, for example, which connect large-diameter lateral openings on the upright beam 3 as well as on the electrical cabinet 8 to one another. Alternately, the electrical cabinet 8 can be attached to abut directly against the upright beam 3, wherein appropriately aligned openings in the side walls of the electrical cabinet 8 and upright beam 3 form the flow connections 12, 13.

In addition, the cavity 11 of the upright beam 3 is interrupted or blocked at the level of the two flow connections 12, 13 by means of a sealing element 15. For example, the sealing element 15 can be a curable sealing foam injected into the cavity 11 via an opening 16 of the upright beam 3. Inflatable balloon plugs can be inserted temporarily into the upright beam 3 from below and from above, for example, to shape the sealing foam during curing to form the sealing element 15.

Alternatively, the sealing element 15 can already be installed during the assembly or installation of the upright beam 3, for example, in the form of a partition wall that is plugged, glued, screwed or welded into this. A further possibility is to insert a sealing element 15 in the form of an elastic sealing plug into the upright beam 3 from one of the ends thereof. In a simple variant a partition wall could also be inserted into the upright beam 3 through a corresponding slot to form the sealing element 15, so long as there are no static reasons opposing this.

During operation, the air column rising in the upright beam 3 as a result of the stack effect is diverted to the electrical cabinet 8 via the flow connection 12 and back to the upright beam 3 via the flow connection 13 (see, arrows 17, 18). Even if this air column has an elevated temperature as a result of heating in the cavity 11 of the upright beam 3, the outside air flowing in via the air inlet 9 has a lower temperature than the interior 14 of the electrical cabinet 8, so that the interior 14 is cooled. Therefore, the further down on the upright beam 3 the electrical cabinet 8 is mounted, the lower the heating of the air column in the upright beam 3 will be prior to its entry into the electrical cabinet 8 and the better the cooling effect will be.

Optionally, a fan 19 can be arranged in the interior of the electrical cabinet 8 for air distribution and to transport the heat convection. Similarly, an extractor fan 20 can be provided, for example, at the air outlet 10 of the upright beam 3.

The invention is not restricted to the represented embodiments, but covers all variants and modifications that fall within the framework of the attached claims. Thus, the upright beam 3 used for cooling the electrical cabinet 8 can also be of any type, e.g. an antenna mast, a roof or facade mounting of a building etc. The electronic components contained in the electrical cabinet 8 can also be accommodated therein in their own internal housing, in which case the interstice between the electrical cabinet 8 and the internal housing faun the interior 14 through which the air passes.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims.

What is claimed is:

1. A device for cooling an electrical cabinet having an interior, a lower end and an upper end, comprising:
    a hollow upright beam having a lower end, an upper end, a cavity inside, an air inlet at the lower end, and an air outlet at the upper end, the upright beam supporting the electrical cabinet on a side of the upright beam;
    a first flow connection formed between the interior of the electrical cabinet and the cavity of the upright beam at a level of the lower end of the electrical cabinet;
    a second flow connection formed between the interior of the electrical cabinet and the cavity of the upright beam at a level of the upper end of the electrical cabinet; and
    a sealing element at an intermediate level between the first and second flow connections to block the cavity of the upright beam, the device thus configured to pass airflow, the airflow entering from outside through the air inlet, passing through the electrical cabinet, and exhausting outside through the air outlet at the upper end.

2. The device according to claim 1, wherein the upright beam is a steel upright of a bridge spanning a road and the air inlet is formed as a discharge opening for condensation at the lower end of the steel upright.

3. The device according to claim 1, wherein the sealing element is a curable sealing foam injected into the cavity.

4. The device according to claim 2, wherein the sealing element is a curable sealing foam injected into the cavity.

5. The device according to claim 1, wherein the electrical cabinet is fitted with a fan for forced convection.

6. The device according to claim 2, wherein the electrical cabinet is fitted with a fan for forced convection.

7. The device according to claim 3, wherein the electrical cabinet is fitted with a fan for forced convection.

8. The device according to claim 1, wherein the air outlet of the upright beam includes an extractor fan.

9. The device according to claim 2, wherein the air outlet of the upright beam includes an extractor fan.

10. The device according to claim 3, wherein the air outlet of the upright beam includes an extractor fan.

11. The device according to claim 4, wherein the air outlet of the upright beam includes an extractor fan.

* * * * *